United States Patent
Fattinger et al.

(10) Patent No.: US 7,535,324 B2
(45) Date of Patent: May 19, 2009

(54) PIEZOELECTRIC RESONATOR STRUCTURE AND METHOD FOR MANUFACTURING A COUPLED RESONATOR DEVICE

(75) Inventors: Gernot Fattinger, Ocoee, FL (US); Klaus Diefenbeck, Munich (DE); Peter Mueller, Pullach (DE); Winfried Nessler, Munich (DE)

(73) Assignee: Avago Technologies Wireless IP, Pte. Ltd., Singapore (SG)

( * ) Notice: Subject to any disclaimer, the term of this patent is extended or adjusted under 35 U.S.C. 154(b) by 125 days.

(21) Appl. No.: 11/764,042

(22) Filed: Jun. 15, 2007

(65) Prior Publication Data

US 2008/0309432 A1    Dec. 18, 2008

(51) Int. Cl.
  *H03H 9/00* (2006.01)
(52) U.S. Cl. .................. 333/189; 333/133; 333/187
(58) Field of Classification Search ............. 333/133, 333/187, 189, 191
  See application file for complete search history.

(56) References Cited

U.S. PATENT DOCUMENTS

| | | |
|---|---|---|
| 6,657,363 B1 | 12/2003 | Aigner |
| 6,720,844 B1 | 4/2004 | Lakin |
| 6,933,807 B2 | 8/2005 | Marksteiner et al. |
| 7,148,604 B2 * | 12/2006 | Inoue et al. ............ 310/322 |
| 2004/0140869 A1 | 7/2004 | Marksteiner et al. |
| 2004/0201305 A1 | 10/2004 | Aigner et al. |
| 2004/0212459 A1 | 10/2004 | Aigner et al. |
| 2005/0062363 A1 | 3/2005 | Aigner et al. |
| 2008/0258845 A1 * | 10/2008 | Schmidhammer ........ 333/195 |

FOREIGN PATENT DOCUMENTS

| | | |
|---|---|---|
| DE | 101 62 540 A1 | 7/2003 |
| DE | 101 62 580 A1 | 7/2003 |
| DE | 102 51 876 A1 | 5/2004 |
| DE | 102 62 056 A1 | 11/2004 |
| EP | 1 418 671 A2 | 5/2004 |
| EP | 1233510 | 10/2008 |
| JP | 2005-513850 | 5/2005 |
| WO | WO 02/095085 A1 | 11/2002 |
| WO | WO 03/052839 A1 | 6/2003 |
| WO | WO 03/052928 A1 | 6/2003 |

\* cited by examiner

*Primary Examiner*—Anh Q Tran (57) ABSTRACT

A method for manufacturing a coupled resonator device includes forming a first part of a plurality of layers, trimming an exposed layer of the first part and forming a remaining part of the plurality of layers. The coupled resonator device includes a stack of the plurality of layers, the plurality of layers including a first piezo-layer with a first and a second electrode layer sandwiching the first piezo-layer, a second piezo-layer with a first and a second electrode layer sandwiching the second piezo-layer, the first and second piezo-layers being acoustically coupled to each other.

34 Claims, 5 Drawing Sheets

PIEZOELECTRIC RESONATOR STRUCTURE AND METHOD FOR MANUFACTURING A COUPLED RESONATOR DEVICE

BACKGROUND

Embodiments of the present invention relate to piezoelectric resonator structures and a method for manufacturing coupled resonator devices and in particular to a frequency trimming of a coupled resonator device.

A bulk acoustic wave (BAW) filter, which comprises a stack with a piezoelectric layer separating a top and a bottom electrode, is an example for a simple piezoelectric resonator. In addition to the simple piezoelectric resonator, coupled resonators or coupled resonator filters (CRF) are also known. As a special implementation of BAWs, the CRFs comprise two BAW resonators generally arranged one on top of the other in a stack. In manufacturing of CRFs a narrow specification with respect to the frequency position (resonance frequency) is needed, particularly for their use as bandpass frequency filters for mobile telecommunication applications (mobile phones). Based on the state of the art accuracy of thin film deposition processes, it is currently not possible to produce a CRF with a reasonable manufacturing yield, relying on deposition accuracy alone. This is particularly the case when specifications of the mobile phones are taken into account. For this reason, one or more additional frequency correction steps (trimming) are used to compensate for inaccuracies, e.g., with respect to layer thickness in thin film deposition processes.

Currently, CRFs have not been used in mobile phones yet. Instead, surface acoustic wave filters (SAW) and recently also the BAW filter with a single piezoelectric layer are used. Normally, SAWs do not need any frequency correction, because their frequency position is mainly defined by a pitch of the interdigital structure, which can be controlled with high accuracy by means of a lithographic process. On the other hand, BAWs need frequency correction, because their frequency position is determined by thicknesses of the layers in the stack, and because the layer thicknesses are controlled by the deposition process, whose accuracy is, however, not sufficient for mobile phones.

In terms of filter performance, SAWs are generally inferior to BAWs and CRFs and therefore cannot be used for most demanding applications. However, SAWs have an intrinsic advantage over BAWs, because they are capable of performing an unbalanced-to-balanced conversion from ingoing to outgoing signals (mode conversion) without effort or extra cost.

On the other hand, BAWs with a single piezoelectric layer exhibit high performance, but they lack the mode conversion option. Therefore, additional effort is needed, for example, via external baluns, and the BAWs thus lose some performance and require additional cost and/or additional space on the board. The CRFs combine the advantages of the BAWs in terms of high performance with the advantages of the SAWs in terms of simple mode conversion. But without frequency trimming, the production of CRFs have a low manufacturing yield, because only a limited quantity meets the required specifications. This is a decisive disadvantage in the manufacturing of CRFs and, in particular, results in increased production costs.

SUMMARY OF THE INVENTION

Embodiments of the present provide a method for manufacturing a coupled resonator device comprises forming a first part of a plurality of layers, trimming an exposed layer of the first part and forming a remaining part of the plurality of layers. The coupled resonator device comprises a stack of the plurality of layers, the plurality of layers comprising a piezo-layer with a first and a second electrode layer sandwiching the first piezo-layer, a further piezo-layer with a first and a second electrode layer sandwiching the further piezo-layer, the piezo-layer and the further piezo-layer being acoustically coupled to each other.

BRIEF DESCRIPTION OF THE DRAWINGS

Embodiments of the present invention will be explained in more detail below with reference to the accompanying drawings, in which.

Before embodiments of the present invention will be explained in more detail below with reference to the drawings, it is to be noted that equal elements or those operating in an equal way are provided with the same or similar reference numerals in the figures, and that a repeated description of these elements is omitted.

DETAILED DESCRIPTION OF ILLUSTRATIVE EMBODIMENTS

A thin film-piezo-device such as a piezoelectric resonator can be classified in a manner that an acoustic energy is propagating in a vertical direction (perpendicular to a surface of a substrate, for example) in a wanted quantity (Q-losses set aside). In general, piezoelectric resonators include at least one piezoelectric layer, which is at least partially arranged between two opposite electrodes (for example, a top electrode and a bottom electrode). The electrodes may comprise multi-layer structures or also single-layer structures, wherein individual layers of the piezoelectric resonator are generally generated with thin film technology.

It is understood that all piezo-layers mentioned in this description can comprise one or more different layers, of which at least one exhibits piezoelectric activity. The other layers between the top and bottom electrode can be non-piezo-active dielectric or other layers to achieve special performance effects like temperature coefficient compensation or to facilitate manufacturing like adhesion layers. In addition, the other layers are typically thin when compared to "real" piezoelectric layer.

The natural frequencies in such piezoelectric resonators essentially depend on the layer thickness of the individual layers (electrode layers, piezoelectric layer, etc.). The deposition accuracy (fabrication tolerance) of the methods used in thin layer technology, for example, PVD (Physical Vapour Deposition), CVD (Chemical Vapour Deposition), vapor deposition, etc., is typically (max−min)/mean value=5-10%.

The layer thicknesses vary within the substrate (wafer) and from substrate to substrate. By optimizing the deposition processes, this thickness variation may be improved up to a (max−min)/mean value of 0.5 to 2% (for an extreme process controlling). For a frequency tolerance of BAW resonators there is, however, a demand for a (max−min)/mean value of ca. 0.1%.

Thus, there is a need for a conventional BAW resonator or for conventional filters comprising a BAW resonator to trim an actual value for the resonance frequency or other resonance properties to given target values. Conventional methods for such a trimming comprise:

a measurement of the actual value of the frequency;

determining a target value for the frequency (for example, by a simulation or a layer stack calculation);

determining an amount of removing (e.g., by etching) or depositing of material from this information or from other sources; and a local etching.

It is possible that the steps (1)-(4) can be performed at different stages of the processing—even multiple times. It may be possible to realize a coarse/fine graining process to improve the results stepwise (in subsequent cycles). This can be done, for example, by an appropriate choice for used materials, i.e., a first trimming step at a first layer comprising a first material yields a major frequency change, whereas a fine tuning may be performed by a second trimming of a second layer comprising a second material. For example, a typical electrode layer comprises different layer and each of them can be trimmed.

Coupled resonator filters (CRFs) or, in general, coupled resonator devices comprise two or more piezo-layers, which are acoustically coupled and stacked vertically and comprise means for extracting electric energy from each of these (two or more) piezo-layers. The last property meaning especially that there are electrodes, for example, being realized as electrically conducting layers (on each side of the piezo-layer). Examples for coupled resonator devices are the coupled resonator filter (CRF), the stacked crystal filter (SCF) or, even more complex, CRF-SCF combinations and also hybrid structures comprising such stacked resonators (for example, CRF-BAW hybrids). Especially for these coupled resonator devices there is a need for adjusting resonance properties appropriately, which means especially to overcome the 5-10% deviations in the deposition of layers due to manufacturing tolerance and to obtain, e.g., 0.1% performance-tolerance. Without trimming, the manufacturing yield is very low, much lower when compared to simple BAW devices.

In more detail, a CRF resonator essentially comprises two single BAW resonators stacked on top of each other and separated from each other by a coupling layer structure comprising one or several coupling layers. These coupling layers determine the type and degree of the acoustic coupling between the two resonators. Typically, the coupling layers comprise a layer arrangement with layers of high or low acoustic impedance. The basic structure of the stack may be constructed either as a membrane suspended between two boundaries of the active region. On the other hand, the stack may also be arranged above an acoustic mirror (for example, in an underlying substrate). Similarly to the coupling layers, the acoustic mirror typically comprises several layers of alternating high and low acoustic impedances.

The two resonators are also denoted by a lower and upper resonator, wherein the arrangement is such that the lower resonator is formed between the upper resonator and the acoustic mirror (or the substrate). In the same way, both electrodes are also denoted by upper and lower electrodes, wherein the lower electrode is arranged between the upper electrode and the substrate (lower refers typically to the direction towards the substrate). Both electrodes of the upper resonator and the corresponding electrodes of the lower resonator may be regarded as two sides of a two-port device (obviously an alternative four-port description is also possible, although more complicated). Given correct resonance frequencies of the two resonators and a correct acoustic coupling between both resonators, the resonator structure exhibits filter behavior. Strictly speaking, since both resonators are coupled they do not exhibit independent resonance frequencies, only for a complete acoustic decoupling both resonators comprise their own resonance frequency.

Conventional trimming methods cannot be simply applied to coupled resonators to trim each of the coupled resonators to a target value, because, as mentioned, a coupled resonator exhibits a different resonance property compared to a single resonator. In contrast, the whole stack needs to be trimmed and each of the components of the stack adjusted to the other element. These steps do not operate independently. This is, even by a multiple tuning of a target frequency, not possible.

Hence, embodiments of the present invention tune first one stack, for example, on a frequency. In a second step, the second stack is tuned appropriately to the frequency of the first stack.

In this sense, the second trimming depends on the result of the first trimming and cannot be regarded as an independent trimming step. A trimming goal can be a center frequency of the filter, but also a bandwidth or another property of the frequency characteristics (for example, asymmetrization of the filter response). In a sense, the first trimming is done with respect to an intermediate specification, and dependent on the result, the second trimming step is done with respect to a final specification.

In a typical situation, a top electrode (as an exposed and hence accessible layer) will be trimmed, but it is also possible that another layer of the layer stack can be trimmed (by changing a thickness of the corresponding layer) and the other layer can also be one of the lower electrodes.

Embodiments of the present invention provide a correction of a frequency or, more generally, a performance of complex piezoelectric structures based on thin film technology and in particular a method for frequency trimming of a CRF is described. In the following a scheme of frequency trimming for one single coupled resonator is described in detail. Although the single resonator by itself already functions as a filter, in most applications a combination of several coupled resonators electrically connected to each other is formed to obtain a multi-stage coupled resonator filter. The obtained multi-stage coupled resonator filter is used for improving the filter characteristics, for impedance matching or for compensating unbalancing effects due to asymmetry. However, the described trimming scheme is independent of these design options and may be applied to any kind of coupled resonators, irrespective of how many stages or which combinations or connections between coupled resonators are chosen.

The characteristic of the filter responses is defined by the acoustic properties of the stack. The frequency position of the passband may be obtained from the resonance frequency of the two resonators, while the bandwidth is given by the degree of coupling between the two resonators. A maximum achievable bandwidth is limited by a combined piezoelectric coupling of the resonators. The relative frequency position of the two resonators should match to the desired degree of coupling.

The implications of this are as follows:

1. The resonance frequencies of the two resonators may be chosen independent of each other. The frequency position of the lower resonator (arranged between the substrate and the upper resonator) determines the passband frequency within very tight limits, and therefore great care should be taken that the frequency position of this resonator is correspondingly adjusted. A potential error will have a direct impact on the passband position of the filter.

2. The coupling between the two resonators may be used to adjust the bandwidth of the filter. This adjustment should be done by variation of the coupling layers, i.e., that part of the stack which is between the lower and the upper resonator (e.g., by adjusting coupling layer thicknesses correspondingly).

3. A frequency adjustment of the upper resonator should be done such that the frequency corresponds to the frequency of the rest of the stack. If second order effects, such as passband deformations, are neglected, a further adjustment of the filter central frequency or the bandwidth is not possible.

Due to process variations in the layer deposition and due to layer thickness altering processes, such as CMP (Chemical Mechanical Polishing), it is nearly impossible to achieve the precise layer thickness for all layers without at least one additional adjustment, such as trimming. The following will describe embodiments for frequency trimming steps and further optional steps.

Embodiments describe trimming of the lower resonator as follows. The lower resonator comprises, for example, a first layer stack with a top electrode and a bottom electrode, which are separated by a piezoelectric layer and the manufacturing may further comprise a structuring. Only after the deposition of the top electrode, it is possible to perform an electrical measurement at the lower resonator and a trimming based thereon.

The following steps should be performed (as part of the trimming procedure):

(a1) First, an electrical measurement, as, e.g., the electrical response, is performed on the first layer stack, wherein layer thicknesses and piezo-coupling coefficients are fitted. If a planarization is done (e.g., by a smoothing or polishing like a CMP-process) when depositing the top electrode, the electrical response characteristic may optionally also be determined prior to the planarization. This allows an improvement of the accuracy of the fit, particularly if it is desired to separate the influence between the top and bottom electrodes.

(b1) Using the results from (a1) for the corresponding layers, a simulation of the complete stack can be performed. In this step, the layer thickness of the top electrode of the lower resonator is simultaneously tweaked with the resonance frequency of the upper resonator. The goal is to bring the simulated filter response into the desired specification and thus to maximize a corresponding margin. As a result of this procedure, a target layer thickness of the top electrode of the lower resonator is determined.

(c1) Using the actual layer thickness of the top electrode of the lower resonator determined in (a1), a trimming of the layer thickness of the top electrode to the target layer thickness determined in (b1) is performed.

(d1) Optionally, a measurement of the resonance frequency of the lower resonator may be performed after the trimming step, and may be compared to a re-evaluation of the stack simulation with the target layer thickness. This allows an accuracy check of the frequency trimming procedure.

In further embodiments, an additional measurement of the layer thickness is performed, in order to obtain a significant improvement of the trimming accuracy. This step may optionally be added, for example, for each frequency-trimming step.

Ideally, the acoustic delay is measured (e.g., by Metapulse) for reflected sound wave. Other measurements are also possible if a set of material parameters is sufficiently known.

After trimming the lower resonator, a coupling layer is deposited on the lower resonator generated up to this point. If the trimming of the top electrode is insufficiently accurate, the subsequent coupling layer deposited on the top electrode can be trimmed as well. This may, for example, be done similarly to what is described above. For example, the coupling layers comprise a layer of high acoustic impedance and two adjacent layers of low acoustic impedance. In this configuration, the layer of high acoustic impedance arranged between the two layers of low acoustic impedance has the highest sensitivity in terms of the acoustic coupling between the two resonators.

If an adjustment of the coupling is needed or desired, an adjustment at the layer of high acoustic impedance can be performed. However, it should be taken into account that gathering of input data for a possible trimming step by electrical measurements requires a significant effort. For example, it may require vias in the layer of low acoustic impedance to provide a direct acoustical contact of the coupling layer of high acoustic impedance with the lower resonator. The reason for this is that the layer of low acoustic impedance may decouple the layer of high acoustic impedance from the resonator. For this reason, a frequency shift of the electrical resonance as a result of a changed layer thickness of the coupling layer of high acoustic impedance is rather small. In most cases, this effect is actually too small to obtain sufficient data for layer thickness adjustment. The only way to circumvent this problem is to open the coupling layer of low acoustic impedance prior to the deposition of the layer of high acoustic impedance so that the layer of high acoustic impedance is deposited directly onto the top electrode of the lower resonator and thus good frequency shift sensitivity is achieved. However, for this at least one additional mask layer for the contacting (vias) and for the opening mentioned above is needed, resulting in an increase in costs for the device (the CRF, for example). Therefore, the most effective way to handle the coupling layer is to design the stack such that it is as insensitive as possible to variations of these layers (i.e., of the coupling layers). In such a case, a local adjustment of the layer thicknesses is generally not needed.

An adjustment of the layer thickness of the top electrode of the upper resonator may, in principle, be performed on the basis of a measurement with respect to the coupled resonator, but it is often better to perform the adjustment based on a filter measurement. A filter-based measurement and a filter-based trimming of the upper top electrode is relying on an evaluation of the symmetry of a measured filter response (normally the return loss peaks) in a range of the center frequency of the passband. However, this becomes impossible if certain features, such as a left or right maximum of the return loss peaks, are absent, because the initial conditions are, for example, improper. This is the case, for example, when the trimming of the lower resonator was not performed properly.

Normally, one or more trimming steps are executed when trimming the upper top electrode. This is particularly the case if the top electrode, as is often the case, comprises several layers which are deposited on the piezoelectric layer of the upper resonator one after the other. In that case, the trimming of the top electrode may include trimming steps for each of the deposited layers that are part of the top electrode. The same multiple trimming steps can optionally also be applied to the top electrode of the lower resonator. All layers deposited on the piezoelectric layer are also referred to as top load. This top load may be part of the actual electrode, such as a metal or metal layer or also an isolator layer, such as the passivation layer, deposited on the metal top electrode. Different sensitivities (frequency shift versus layer thickness change) for different parts of the top load can be utilized to perform a coarse-fine trimming combination.

Conventional trimming methods on single piezolayer BAW resonators/filters use a characteristic frequency feature of the resonator or filter, e.g., the series resonance of a resonator or the 10 db crossing of the insertion loss curve at the transition band. In contrast, embodiments of the present invention use a different target parameter, namely the general shape of the filter, such as the symmetry of a measured return loss peak. A correlation between a desired change of the filter shape and a needed change of the layer thickness may be determined in this trimming step either by means of a simulation or experimentally. This may, for example, be done by linear interpolation between two known cases, such as before and after the deposition of one particular layer.

The steps for trimming the top electrode of the upper resonator may be summarized as follows:

(a2) First, another fit of the layer stack (i.e., particularly the actual values of layer thicknesses and the piezo-couplings) to a further electrical measurement is performed, wherein the further electrical measurement may be conducted either with respect to the coupled resonator or the filter responses. In general, the previously in the steps (a1)-(d1) fitted layers, for example, the top electrode of the lower resonator and/or the coupling layers, remain unchanged, although, in certain cases, small adjustments in the previous fit may result in an increase of the accuracy of the prediction for the stack and thus the trimming results.

(b2) Using the results of (a2) for the corresponding layers, a simulation of the complete stack can be performed. In this step, the layer thickness of the top electrode of the upper resonator is correspondingly tweaked in order to symmetrize the filter (trimming goal). Normally, this is identical to a procedure in which the simulated filter response is brought within the specification, and which leads to a maximization with respect to the corresponding margins. This procedure yields a target layer thickness for the top electrode of the upper resonator.

(c2) Next, there is an adjustment or trimming of the layer thickness of the top electrode of the upper resonator having the actual value determined in (a2) to the target layer thickness corresponding to the value determined in (b2).

(d2) Optionally, a measurement of the resonance frequency of the upper resonator or the filter response is performed after the adjustment or adaptation of the layer thickness is carried out. The obtained result can be compared to a re-evaluation of the stack simulation using the target layer thickness. This allows checking the accuracy (quality) of the frequency trimming procedure.

The described trimming steps may be used individually, but can also be combined.

Thus, embodiments of the present invention provide a method for manufacturing a coupled resonator device comprising forming a first part of a plurality of layers, trimming an exposed layer of the first part and forming a remaining part of the plurality of layers. And in further embodiments, the step of forming the remaining part comprises forming a further part of the plurality of layers, trimming a further exposed layer of the further part of the plurality of layers and forming a last part of the plurality of layers, wherein a trimming goal of the trimming of the further exposed layer depends on a trimming result of the trimming of the exposed layer. The coupled resonator device comprises a stack of the plurality of layers, the plurality of layers comprising a piezo-layer with a first and a second electrode layer sandwiching the piezo-layer, a further piezo-layer with a further bottom and a further top layer sandwiching the further piezo-layer, the piezo-layer and the further piezo-layer being acoustically coupled to each other.

In yet another embodiment, an optional further trimming comprises an adjustment of an acoustic coupling between the two stacks, which are arranged vertically. Therefore, in this coupled trimming procedure, a first trimming is done with respect to a target value (for example, with respect to the lower stack) and a following trimming step is done, wherein the target value of the following trimming step depends on the target value of the first trimming step. Trimming steps according to embodiments use two intermediate stages of processing to perform the trimming procedure, because otherwise the lower layers are not accessible or exposed for a correction or trimming.

Trimming goals comprise a filter response characteristic with pre-determined target values of a central frequency and a bandwidth and a symmetric shape of the response characteristic, and in further embodiments, the trimming steps are performed with respect to at least one of the trimming goals. In further embodiments, further parameters as, for example, further layer thicknesses, piezo-coupling coefficients etc., are determined.

Further embodiments describe a method for manufacturing a coupled resonator, in which the first resonator is initially formed and comprises, for example, a layer structure with a bottom electrode and a top electrode separated by a piezo-electric layer. The step of forming an exemplary top electrode can also comprise a planarization and in this case, the measurement can be done before and/or after the planarization step.

In addition, further layer thicknesses or acoustic coupling coefficients may be determined in the performed measurement. The desired resonance characteristics include, for example, the resonance frequency of the first resonator. After the layer thickness adjustment of the top electrode to a target layer thickness has been done, an optional check measurement can be performed in order to determine the quality of the layer thickness alteration therefrom. Errors that may occur in the layer thickness alteration may thus be detected and can be taken into account in future trimming steps. Furthermore, the layer thickness of the top electrode or also layer thicknesses of further electrodes may be determined by alternative methods (time delay measurements for reflected sound waves) and used for a control measurement.

Further embodiments include a method for manufacturing a coupled resonator device comprising forming a first part of the plurality of layers, trimming an exposed layer of the first part, forming the coupling layer, trimming a coupling layer and forming a remaining part of the plurality of layers. The trimming comprises a change of a thickness of the exposed layer and/or a change of a thickness of the coupling layer and is performed with a trimming goal comprising a filter characteristic with pre-determined values of a central frequency and/or of a bandwidth and/or a shape of a response characteristic. The coupled resonator device comprising a stack of a plurality of layers, the plurality of layers comprising a piezo-layer with a first and a second electrode layer sandwiching the piezo-layer, a coupling layer and a further piezo-layer with a further first and a further second electrode layer sandwiching the further piezo-layer, the coupling layer defining an acoustic coupling between the piezo-layer and the further piezo-layer. The coupling layer can, e.g., be used to adjust (or reduce) the acoustic coupling to a desired value.

Furthermore, the acoustic coupling layer may comprise a layer sequence of several layers of different acoustic impedances, wherein there are alternating layers of low acoustic impedance and high acoustic impedance. Because the layer of high acoustic impedance influences the resonator characteristic particularly with respect to its layer thickness, it can be useful to put the layer of high acoustic impedance directly onto the top electrode and to contact it directly with the top electrode. If a layer of low acoustic impedance was first deposited on the top electrode, an opening should be generated in the layer of low acoustic impedance on separate test structures for this purpose, so that the layer of high acoustic impedance is in direct acoustic contact with the top electrode. The separate test structures comprise, e.g., a device that is sacrificed for testing purposes and can be located at different places over the wafer.

Embodiments of the present invention describe also a method for manufacturing a coupled resonator filter with a stack of a plurality of layers, the method comprising providing a substrate with an acoustic mirror, forming a piezo-element with a bottom and a top electrode layer sandwiching a piezo-layer, the bottom electrode layer being arranged between the acoustic mirror and the piezo-layer, and trimming the top electrode layer. The method further comprises forming a coupling layer, forming a further piezo-element with a further bottom and a further top electrode layer sandwiching a further piezo-layer, the further bottom electrode layer being arranged between the coupling layer and the further piezo-layer and trimming the further top electrode. The coupling layer defines an acoustic coupling between the piezo-layer and the further piezo-layer, the trimming of the top electrode comprises an adaptation of a resonance frequency to a target value and the trimming of the further top electrode is performed such as to achieve a pre-determined target filter characteristic.

Embodiments also describe a wafer comprising a plurality of layers, wherein a coupled resonator is formed in the layers, and each coupled resonator comprises a first resonator, a second resonator and a coupling layer separating the first and second resonator. A layer from the plurality of layers often comprises fluctuations of the layer thickness. In embodiments, the fluctuations are related to fluctuations of a further layer from the plurality of layers, wherein the relationship is given by a fixed relation, and the relationship comprises an accuracy of less than 1%. Thus, both layers thicknesses are, for example, correlated with a fluctuation range of about 1% or 0.5% over at least 90% of a wafer surface.

Embodiments of the inventions also comprise a set of coupled resonator devices with a plurality of layers. Each coupled resonator device comprises a first resonator formed in a first plurality of a plurality of layers, a second resonator formed in a second plurality of the plurality of layers and a coupling layer structure formed in a third plurality of the plurality of layers arranged between the first and the second plurality of the plurality of layers.

The coupled resonator device-wise fluctuation of a layer thickness of a first layer of one of the first, second and third plurality of the layers is related, by a given relation, to a fluctuation of a further layer thickness of a second layer of a different one of the first, second and third plurality of the layers with an accuracy of less than 1%. The set of coupled resonator devices can be obtained, for example, by a dicing of a corresponding wafer described above.

Further embodiments describe a wafer comprising a substrate, a resonator with a layer arrangement, a first coupling layer with an opening and a second coupling layer contacting the resonator through the opening. The first coupling layer further comprises a first acoustic impedance, the second coupling layer comprises a second acoustic impedance, wherein the second acoustic impedance is higher than the first acoustic impedance.

The measurements in the different embodiments, to determine, e.g., a thickness of a layer, can be done at several places on a wafer, i.e., at each place, for example, one measurement. An interpolation of the values at the several places will result in a distribution of, for example, the thickness of the layer (or other measured quantities) over the wafer. The interpolated values give a layer thickness profile and can be used to perform a local change of the thickness of the layer. There is no need to perform the measurement at each coupled resonator device. As long as there are enough measurements over the wafer, e.g., between 50 and 2000 or around 200 measurements, the fluctuations, e.g., of the layer thickness, over the wafer can be obtained with a high accuracy. Since on one hand the measurements at the several places are time consuming and on the other hand may alter the layer structure (often test resonator devices are used for this), it is advantageous to find an optimal number of measurements, which ensures a sufficient accurate result for the fluctuations, but avoids needless measurements. This gives a preferred segmentation of the wafer, where each of the several places is located in one segment, for example in ca. 200 segments each comprising, for example, 50 to 500 coupled resonator devices.

In general, there is a non-liner relation between thickness variations of layers and, for example, achieved frequency variations (e.g., in the resonance frequency). One reason for this is that different layers comprising different materials contribute differently to possible frequency shifts. This nonlinear relation is taken into account, e.g., by the simulation or by experimental determination of the linear behavior and its nonlinear corrections.

The trimming is performed by the layer thickness adjustment (adaptation of an actual to a target value) and can be carried out by different means, e.g., by an etching or by a polishing or by adding a mass load layer (in order to increase the thickness).

Hence, embodiments describe a method to perform frequency trimming of a CRF. The use of this method allows the manufacture of CRFs of high quality in large numbers, providing a high yield. Therefore, embodiments of the present invention are particularly advantageous in a high volume market, such as, is the case in the mobile phone market with CRF.

Figure 1:
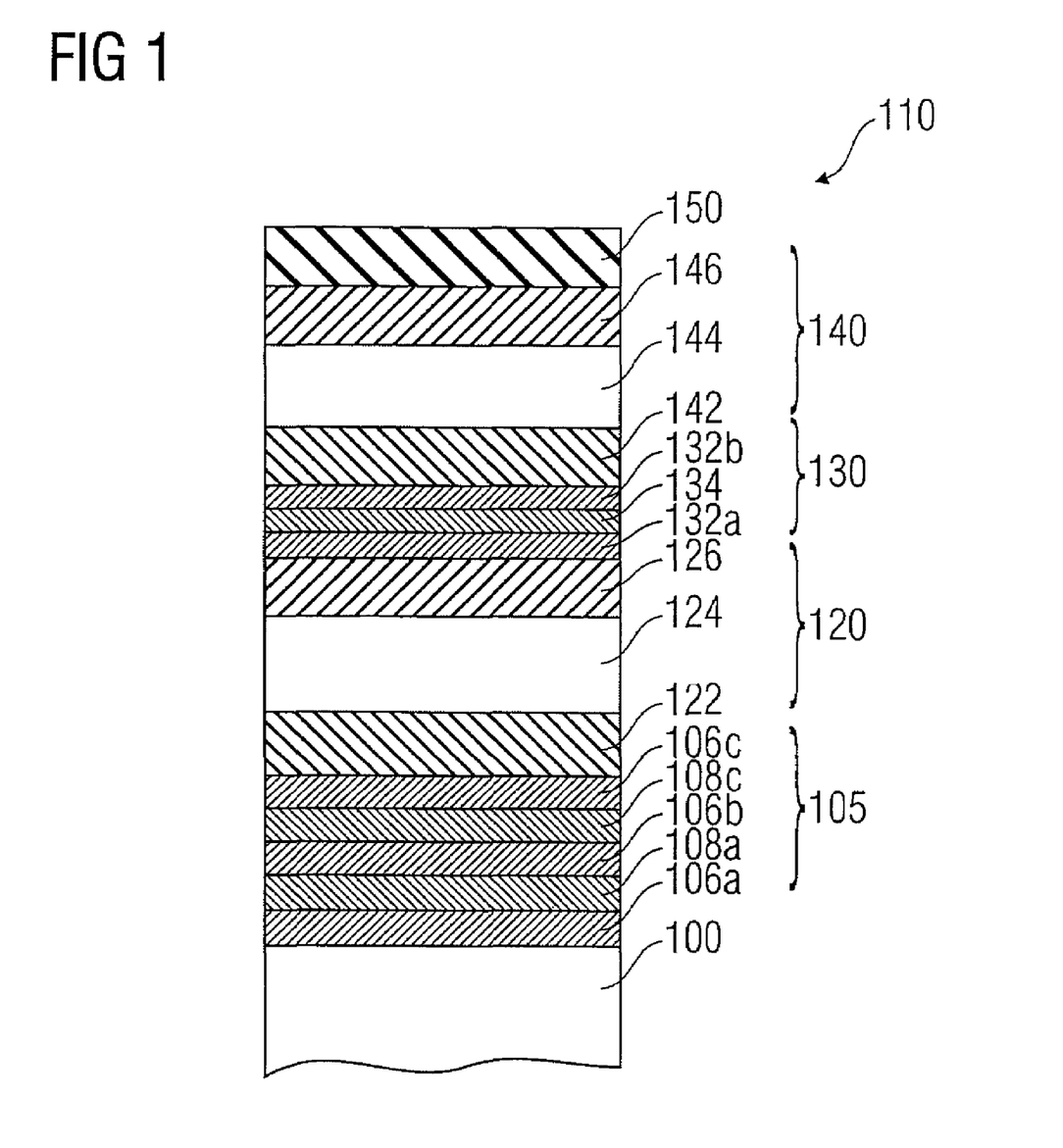
FIG. 1 shows a completely assembled coupled resonator stack.

FIG. 1 shows a cross-section of a piezoelectric resonator structure 110 (or simply a piezo-element) in which, on a substrate 100, an acoustic mirror 105 is arranged, on which there are deposited a first resonator 120, an acoustic coupling layer 130, and a second resonator 140. The acoustic mirror 105 comprises an alternating layer sequence of layers of low acoustic impedance 106a-c and layers of high acoustic impedance 108a-b. In the shown embodiment, there is first formed a first layer of low acoustic impedance 106a on the substrate 100, and then there is a first layer of high acoustic impedance 108a followed by a second layer of low acoustic impedance 106b, followed by a second layer of high acoustic impedance 108b, and finally a third layer of low acoustic impedance 106c.

The first resonator 120 comprises a first or bottom electrode 122, a piezoelectric layer 124 (or simply piezo-layer) and a second or top electrode 126. The acoustic coupling layer 130 between the first resonator 120 and the second resonator 140 comprises an alternating layer sequence of coupling layers of low acoustic impedance 132a-b and a coupling layer of high acoustic impedance 134. In the shown embodiment, a first coupling layer of low acoustic impedance 132a is first deposited on the top electrode 126 of the first resonator 120. Next, there is a coupling layer of high acoustic impedance 134, and finally a second coupling layer of low acoustic impedance 132b. The second resonator 140 comprises a further bottom electrode 142, a further piezoelectric layer 144 and a further top electrode 146. Finally, the piezoelectric resonator structure 110 comprises a passivation layer 150.

Figure 2:
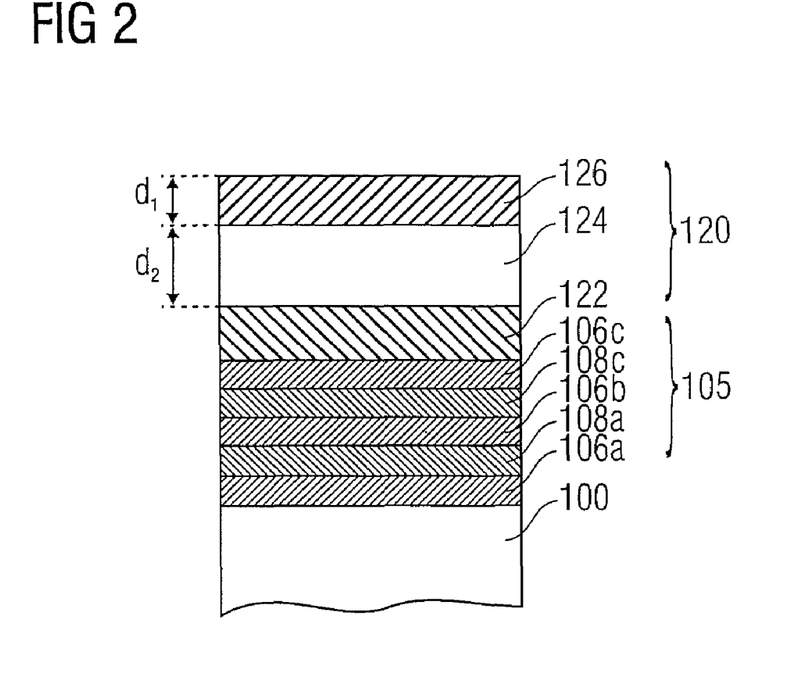
FIG. 2 shows a first part of the assembled coupled resonator stack with a first resonator.

FIG. 2 shows a cross-sectional view of a first part of an assembled piezoelectric resonator structure 110, wherein the acoustic mirror 105 is first formed on the substrate 100. As described above, the acoustic mirror 105 is formed by alternately depositing layers of acoustic impedance. In the shown embodiment, the first layer of low acoustic impedance 106a is first deposited, whereupon the first layer of high acoustic impedance 108a is deposited, whereupon there are further deposited the second layer of low acoustic impedance 106b, the second layer of high acoustic impedance 108b and finally the third layer of low acoustic impedance 106c. The bottom electrode 122 is first deposited on the substrate 100 with the acoustic mirrors 105, followed by the piezoelectric layer 124, and the last layer deposited is the top electrode 126.

In an embodiment, the manufacturing process of the piezoelectric resonator structure 110 is interrupted at this point to perform a trimming of a layer thickness d1 of the top electrode 126. For this purpose, an actual value of the layer thickness d1 is first determined by means of an electrical measurement at the first resonator 120, and then a target layer thickness is determined in a simulation for the whole piezoelectric resonator 110. The trimming is performed by adjusting the layer thickness d1 from the actual value to the target value. When performing this method step, it is advantageous if the actual layer thickness is larger than the target layer thickness of the top electrode 126, i.e., it is advantageous if the top electrode 126 is deposited with a layer thickness d1 larger than a target value to be expected for the layer thickness d1. The target layer thickness will depend on an actual value of the thickness d2 of the piezoelectric layer 124 and on the actual value of all other layers deposited so far. In fact, the target value will compensate fluctuations in the thickness d2 and in all other layers deposited so far.

Figure 3:
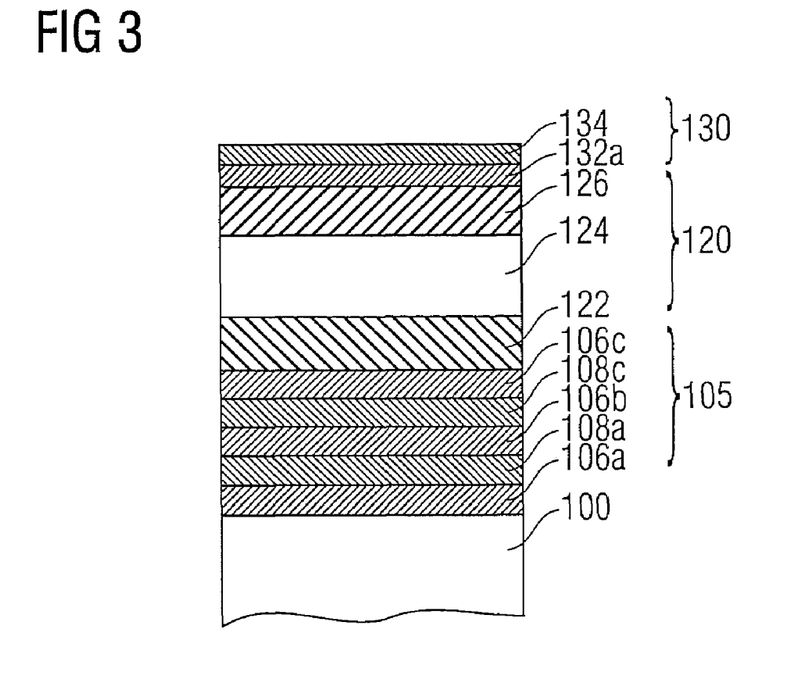
FIG. 3 shows a second part of the assembled coupled resonator stack with the first resonator and a coupling layer structure.

FIG. 3 shows a cross-sectional view of a second part of the assembled piezoelectric resonator structure 110. As it is illustrated in FIG. 2, the acoustic coupling layer 130 comprises a layer assembly, where the first coupling layer of low acoustic impedance 132a is deposited on the top electrode 126 followed by the coupling layer of high acoustic impedance 134. At this stage of processing of the piezoelectric resonator structure 110, there may again be a trimming step. However, for this purpose an electrical measurement at the first resonator 120 is needed, which needs to be electrically contacted for this purpose. Therefore, if no other contacting is possible an opening is generated in the acoustic coupling layer 130 to be able to perform a through-connection of the top electrode 126 (not shown in FIG. 3).

Figure 4:
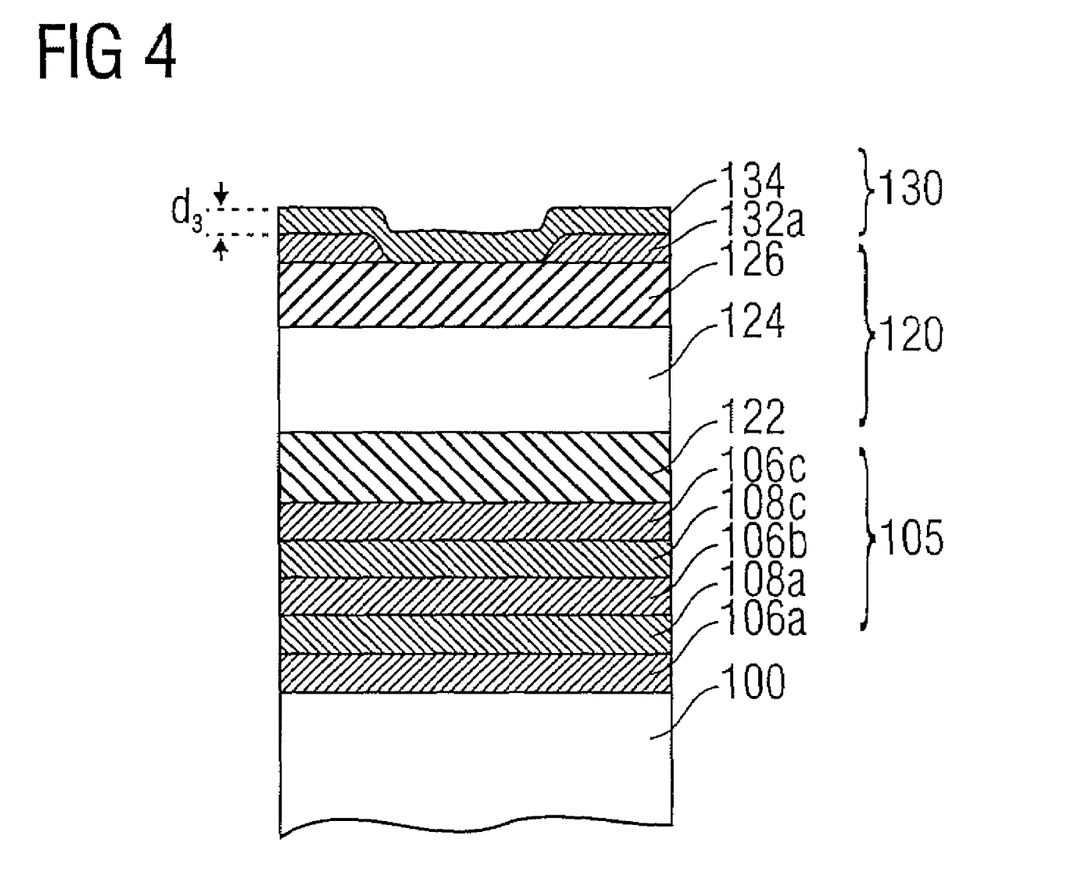
FIG. 4 shows the second part of the assembled coupled resonator stack with the first resonator and the coupling structure comprising an opening.

FIG. 4 shows a cross-sectional view similar to the one shown in FIG. 3. However, the coupling layer of low acoustic impedance 132a comprises an opening, and the coupling layer of high acoustic impedance 134 is in contact to the top electrode 126 through the opening. This may be advantageous particularly if, in the trimming method step for the acoustic coupling layer 130, the coupling layer of low acoustic impedance 132a effectively results in an acoustic decoupling of the top electrode 126 and the coupling layer of high acoustic impedance 134. Since, in the course of the trimming process for the acoustic coupling layer 130, a potential layer thickness alteration is made for the coupling layer of high acoustic impedance 134, it is important to ensure that during an electrical measurement process, which is again executed at the first resonator 120, the coupling layer of high acoustic impedance 134 influences the measurement result. If this is not the case, no information about the thickness can be obtained from the electrical measurement. The first resonator 120 is correspondingly stimulated also in this trimming step, and the response behavior or the resonance frequency is examined (the via-contract of the first resonator 120 through the acoustic coupling layer 130 is not shown in FIG. 4). An actual value for the layer thickness d3 of the coupling layer of high acoustic impedance 134 is determined from the electrical measurement, wherein, for example, a simulation for the piezoelectric resonator structure 110, i.e., particularly the parts still to be generated in later steps, is used. From the simulation, a target layer thickness of the coupling layer of high acoustic impedance 134 is obtained from a bandwidth of a completely processed resonator. Finally, the thickness d3 is adjusted to the target layer thickness.

Figure 5:
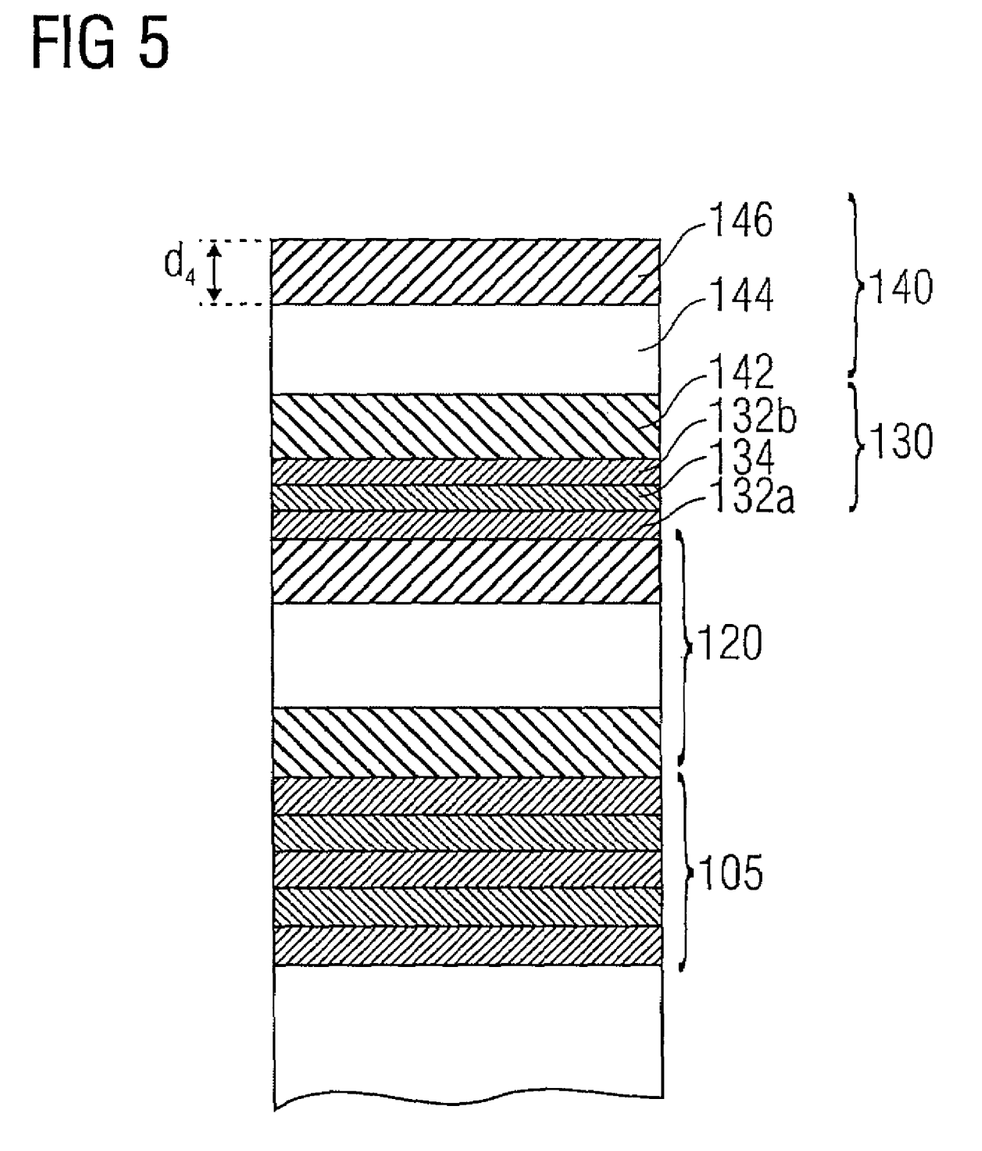
FIG. 5 shows a fourth part of the assembled coupled resonator stack with the first resonator, the coupling layer and a second resonator.

FIG. 5 shows a cross-sectional view of a third part of the assembled piezoelectric resonator structure 110, in which, based on the arrangement shown in FIG. 3, there is first deposited the second coupling layer of low acoustic impedance 132b, and subsequently the further bottom electrode 142, the further piezoelectric layer 144 and the further top electrode 146 are arranged.

At this point, the manufacturing process for the piezoelectric resonator structure 110 may again be interrupted to perform a further trimming. The resonator processed so far is contacted, and an electrical measurement is conducted, with the help of actual values which are again determined, such as for a layer thickness d4 of the further top electrode 146, and the determined actual values are used in a subsequent simulation to determine a target value for the layer thickness d4 of the further top electrode 146 from a desired resonator characteristic. The simulation goal in this trimming process is, for example, a symmetrized form or shape of the filter response (filter characteristic). This will be explained in more detail in the following.

The interruption of the manufacturing process in order to perform the electric measurement and a subsequent trimming was demonstrated so far for a specific coupled piezoelectric resonator structure 110. In further embodiments this procedure is repeated at further places on a wafer. Therefore, a plurality of values (actual and target values) for the thickness of the layer at different places is obtained. In order to perform a trimming of the layer thickness over the wafer, the plurality of values is interpolated over the wafer yielding a thickness profile so that at different places on the wafer the trimming can be performed differently.

Figure 6A:
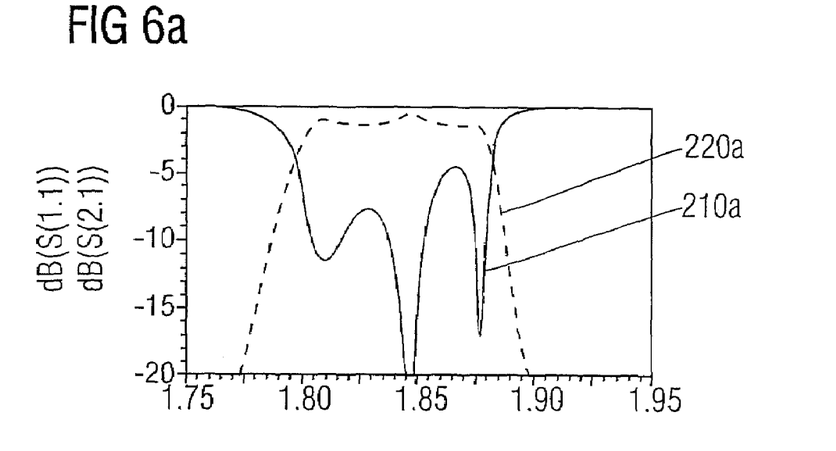
FIGS. 6A-6C show graphs for resonator response characteristics for various thicknesses of a top electrode.
Figure 6B:
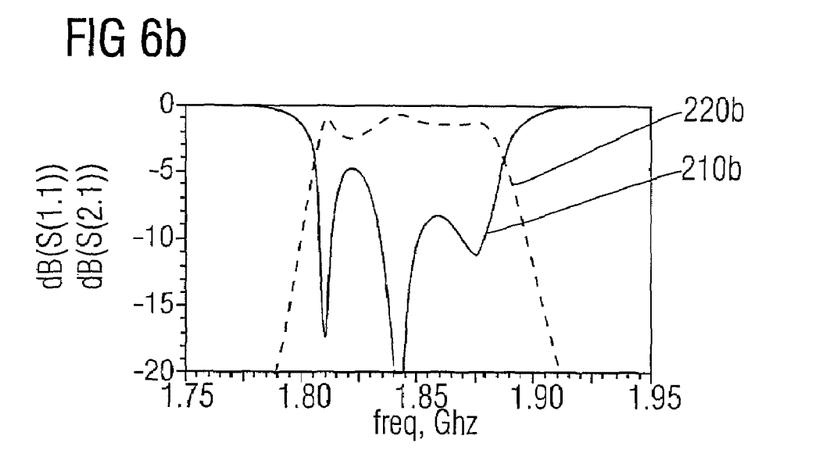
Figure 6C:
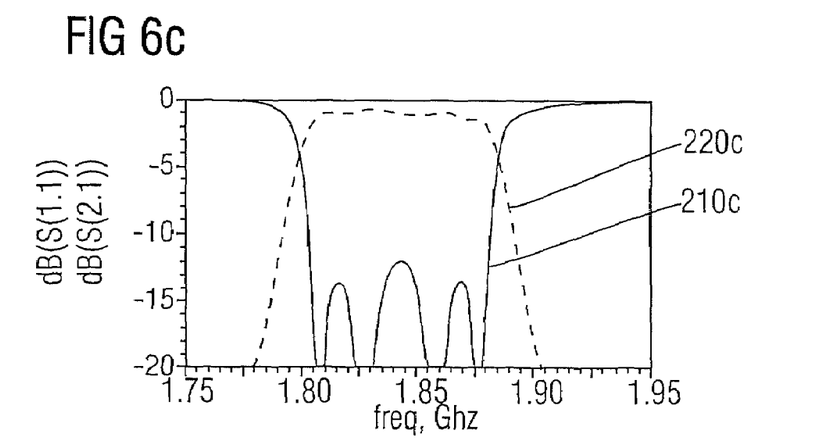

FIG. 6 shows illustrations that show how a trimming goal of the further top electrode 134, as described with respect to FIG. 5, may be achieved. In FIGS. 6A to 6C, there are respectively shown two graphs 210a-c and 220a-c for attenuations as functions of the frequency of the applied signal. The graphs 210a-c show a return-loss signal, i.e., they show how much a signal returning from the coupled resonator structure 110 is suppressed. The graphs 220a-c show an insertion-loss signal, i.e., they show the attenuations for signals passing the coupled resonator structure 110. The passband of the coupled resonator structure 110 is approximately between the frequencies 1.805 and 1.88 GHz, i.e., outside this range there is a very strong attenuation of the signal 220 and nearly no attenuation for the signal 210.

In FIG. 6A, the signal 210a comprises two maximums and three minimums within the passband (including transition bands), which are arranged in an asymmetric way around the center of the bandpass, which is at approximately 1.84 GHz. Such a shape of the return-loss signal 210a indicates a layer thickness of the further top electrode 146 below an ideal value (i.e., it is too thin).

In FIG. 6B, the signal 210b again has two maximums and three minimums within the bandpass, which are again not distributed symmetrically. In contrast to the illustration of FIG. 6A, in the graph 210b the maximum with the higher frequency is formed weaker in FIG. 6B. This means that the layer thickness d3 of the further top electrode 146 is above an optimum value for the characteristic shown in FIG. 6B, while it was below an optimum value for the characteristic shown in FIG. 6A. The signal 220b (the insertion-loss signal) does not show a violation of the symmetry to such an extent, as it is the case for the signal 210b. For this reason, the signal 210b is better suited to use in the trimming of the layer thickness of the further top electrode 146.

FIG. 6C shows a signal 210c extending symmetrically around a center frequency of the bandpass, i.e., approximately at 1.84 GHz. This means that the layer thickness d4 of the further top electrode 146 has an optimal value and does not need any trimming. In the graph shown in FIG. 6C, the signal 220c is nearly flat within the bandpass and decreases drastically outside the bandpass, i.e., it has a very high attenuation outside the bandpass and is very transmissive within the bandpass, equally for all frequencies. Hence, the response characteristics as shown in FIG. 6C represent the goal in the trimming process, which is done with respect to the thickness d4 of the further top electrode 146.

What is claimed is:

1. A method for manufacturing a coupled resonator device, the coupled resonator device comprising a stack of a plurality of layers, the plurality of layers comprising a piezo-layer with a first and a second electrode layer sandwiching the piezo-layer, a further piezo-layer with a first and a second electrode layer sandwiching the further piezo-layer, the piezo-layer and the further piezo-layer being acoustically coupled to each other, the method comprising:
    forming a first part of the plurality of layers;
    trimming an exposed layer of the first part; and
    forming a remaining part of the plurality of layers.

2. The method according to claim 1, wherein forming the remaining part comprises:
    forming a first part of the remaining part of the plurality of layers;
    trimming an exposed layer of the first part of the remaining part of the plurality of layers; and
    forming a remaining part of the remaining part of the plurality of layers.

3. The method according to claim 2, wherein a trimming goal of the trimming of the exposed layer of the first part of the remaining part depends on a trimming result of the trimming of the exposed layer of the first part.

4. The method according to claim 3, wherein the trimming goal comprises a filter characteristic with pre-determined values of a central frequency and a bandwidth and a shape of a response characteristic of the coupled resonator device.

5. The method according to claim 2, wherein trimming the exposed layer of the first part comprises adapting a thickness of the exposed layer of the first part to a first target value or wherein trimming the exposed layer of the first part of the remaining part comprises adapting the thickness of the exposed layer of the first part of the remaining part to a second target value.

6. The method according to claim 5, wherein adapting the thickness is performed with a different amount at laterally spaced-apart sites of the plurality of layers.

7. The method according to claim 1, wherein trimming the exposed layer comprises performing a measurement to determine an actual value of a parameter of the stack.

8. The method according to claim 7, wherein the actual parameter value comprises a thickness of a layer and/or an acoustic coupling coefficient of the stack.

9. The method according to claim 2, wherein trimming the exposed layer comprises performing a measurement, the measurement involving resonating the piezo-layer and/or the piezo-layer and the further piezo-layer.

10. The method according to claim 1, wherein trimming the exposed layer comprises structuring the exposed layer so that the exposed layer comprises an opening and contacting another layer of the plurality of layers via the opening in order to perform a measurement involving the piezo-layer, the trimming depending on the measurement.

11. The method according to claim 1, wherein the exposed layer comprises the second electrode layer participating in sandwiching the piezo-layer or the further piezo-layer and wherein trimming the exposed layer further comprises:
    performing a first measurement in order to determine a layer thickness of the second electrode layer;
    performing a polishing of the second electrode layer; and
    performing a second measurement in order to determine the layer thickness of the second electrode layer.

12. The method according to claim 1, wherein forming the remaining part comprises a performing measurement of an actual value for a resonator frequency of the first part.

13. A method for manufacturing a coupled resonator device, the coupled resonator device comprising a stack of a plurality of layers, the plurality of layers comprising a piezo-layer with a first and a second electrode layer sandwiching the piezo-layer, a coupling layer structure and a further piezo-layer with a first and a second electrode layer sandwiching the further piezo-layer, the coupling layer structure defining an amount of acoustic coupling between the piezo-layer and the further piezo-layer, the method comprising:
    forming a first part of the plurality of layers;
    trimming an exposed layer of the first part;
    forming a first part of the coupling layer structure;
    trimming the coupling layer structure; and
    forming a remaining part of the plurality of layers.

14. The method according to claim 13, wherein trimming the exposed layer and/or trimming the coupling layer structure comprises changing a thickness of the exposed layer and/or changing a thickness of the coupling layer structure.

15. The method according to claim 13, wherein a trimming goal of the trimming of the exposed layer and/or trimming of the coupling layer structure comprises a filter characteristic of the coupled resonator device with pre-determined values of a central frequency and/or of a bandwidth and/or a shape of a response characteristic.

16. The method according to claim 13, wherein forming the coupling structure layer comprises:
    forming a first coupling layer with a first acoustic impedance; and
    forming a second coupling layer with a second acoustic impedance,
    wherein the second acoustic impedance is higher compared to the first acoustic impedance.

17. The method according to claim 16, wherein forming the first coupling layer comprises structuring the first coupling layer in order to form an opening and wherein forming the second coupling layer comprises contacting the second coupling layer to the first coupling layer via the opening.

18. The method according to claim 14, wherein the plurality of layers extends laterally and at least one of the changes of the thicknesses of the exposed layer and of the coupling layer structure is performed in dependence on a position along the lateral extension of the plurality of layers.

19. The method according to claim 13, further comprising:
providing a substrate with an acoustic mirror, the stack of the plurality of layers being formed adjacent to the substrate,
wherein the acoustic mirror comprises a layer assembly of alternating high and low acoustic impedance materials.

20. The method according to claim 13, wherein at least one trimming comprises etching with a varying amount of etching during the trimming step.

21. The method according to claim 13, wherein the exposed layer is the first or second electrode layer.

22. The method according to claim 13, wherein trimming of the exposed layer and/or the coupling layer structure further comprises measuring an actual layer thickness of the coupling layer structure or a part of the coupling layer structure and/or measuring a further thickness of at least one further layer of the plurality of layers.

23. A method for manufacturing a coupled resonator device, the coupled resonator device comprising a stack of a plurality of layers, the method comprising:
providing a substrate with an acoustic mirror;
forming a piezo-element with a bottom electrode layer and a top electrode layer sandwiching a piezo-layer, the bottom electrode layer being arranged between the acoustic mirror and the piezo-layer;
trimming the top electrode layer;
forming a coupling layer structure;
forming a further piezo-element with a further bottom electrode layer and a further top electrode layer sandwiching a further piezo-layer, the further bottom electrode layer being arranged between the coupling layer structure and the further piezo-layer; and
trimming the further top electrode layer,
wherein the coupling layer structure defines an amount of an acoustic coupling between the piezo-layer and the further piezo-layer, and
wherein trimming the top electrode layer comprises an adaptation of a resonance frequency to a target value and trimming the further top electrode layer is performed to achieve a pre-determined target filter characteristic.

24. The method according to claim 23, wherein the target filter characteristic comprises a bandwidth of the coupled resonator device and/or a symmetric shape of a response characteristic.

25. The method according to claim 23, wherein the trimming comprises adding a mass load layer to the top electrode layer or the further top electrode layer.

26. The method according to claim 23, wherein forming the coupling layer structure comprises:
forming a first coupling layer with a first acoustic impedance; and
forming a second coupling with a second acoustic impedance,
wherein the second acoustic impedance is higher compared to the first acoustic impedance.

27. The method according to claim 23, further comprising measuring an acoustic coupling between the piezo-element and the further piezo-element.

28. The method according to claim 23, wherein forming the acoustic mirror comprises forming a first layer with a first acoustic impedance and forming a second layer with a second acoustic impedance, wherein the second acoustic impedance is higher compared to the first acoustic impedance.

29. The method according to claim 23, further comprising forming an acoustic isolator in or on the substrate, the acoustic isolator to suppress a propagation of an acoustic wave from the coupled resonator device into the substrate.

30. The method according to claim 23, wherein at least one of the bottom electrode layer, the top electrode layer, the further bottom electrode layer and the further top electrode layer comprises aluminum or tungsten.

31. A coupled resonator device manufactured according to a method according to claim 1.

32. A coupled resonator device manufactured according to a method according to claim 13.

33. A coupled resonator device manufactured according to a method according to claim 23.

34. A wafer comprising:
a substrate;
a resonator with an assembly of layers;
a first coupling layer comprising an opening, the first coupling layer comprising a first acoustic impedance; and
a second coupling layer comprising a higher acoustic impedance when compared to the first coupling layer,
wherein the first coupling layer is arranged between the resonator and the second coupling layer, so that the second coupling layer contacts the resonator via the opening.

* * * * *